United States Patent
Honda (10) Patent No.: US 7,292,477 B2
(45) Date of Patent: Nov. 6, 2007

(54) NONVOLATILE SEMICONDUCTOR MEMORY DEVICE WHICH STORES MULTIVALUE DATA

(75) Inventor: Yasuhiko Honda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 18 days.

(21) Appl. No.: 11/401,421

(22) Filed: Apr. 11, 2006

(65) Prior Publication Data

US 2006/0227645 A1    Oct. 12, 2006

(30) Foreign Application Priority Data

Apr. 12, 2005   (JP)   ............................. 2005-114748

(51) Int. Cl.
*G11C 11/34* (2006.01)
*G11C 7/00* (2006.01)

(52) U.S. Cl. ........................... 365/185.22; 365/185.18; 365/185.19; 365/236

(58) Field of Classification Search ........... 365/185.18, 365/185.19, 185.22, 189.01, 236, 185.24
See application file for complete search history.

(56) References Cited

U.S. PATENT DOCUMENTS

| | | | |
|---|---|---|---|
| 5,946,231 A | | 8/1999 | Endoh et al. |
| 6,655,758 B2 * | | 12/2003 | Pasotti et al. ........... 365/185.24 |
| 6,788,579 B2 | | 9/2004 | Gregori et al. |
| 6,937,520 B2 | | 8/2005 | Ono et al. |

FOREIGN PATENT DOCUMENTS

JP          11-39887        2/1999

* cited by examiner

*Primary Examiner*—Son Dinh
(74) *Attorney, Agent, or Firm*—Oblon, Spivak, McClelland, Maier & Neustadt, P.C.

(57) ABSTRACT

A voltage generating circuit supplies first gate voltage to the control gate of a memory cell for a first control time period and supplies write voltage to the drain for a first write time period which is shorter than the first control time period when an operation of writing data into the memory cell is started. As the verify result, if it is detected that a data amount written into the memory cell is insufficient, the voltage generating circuit supplies second control voltage obtained by raising the first control gate voltage by constant voltage to the control gate for a time period which is shorter than the first control time period and supplies write voltage to the drain for a second write time period which is shorter than the first write time period.

20 Claims, 12 Drawing Sheets

FIG. 16

NONVOLATILE SEMICONDUCTOR MEMORY DEVICE WHICH STORES MULTIVALUE DATA

CROSS-REFERENCE TO RELATED APPLICATIONS

This application is based upon and claims the benefit of priority from prior Japanese Patent Application No. 2005-114748, filed on Apr. 12, 2005, the entire contents of which are incorporated herein by reference.

BACKGROUND OF THE INVENTION

1. Field of the Invention

This invention relates to, for example, a NOR type nonvolatile semiconductor memory device which stores multivalue data.

2. Description of the Related Art

For example, various types of nonvolatile semiconductor memory devices (which are hereinafter referred to as flash memories) which are configured by EEROM cells and in which data can be electrically and simultaneously erased are developed. The flash memories are roughly divided into NAND type memories and NOR type memories. In the flash memory of either type, it is required to precisely and rapidly control the threshold voltage set for the memory cell at the data write time or erase time. Conventionally, in the NAND type flash memory, a method to increase the write voltage in stages in order to precisely and rapidly set the threshold voltage is developed (for example, Jpn. Pat. Appln. KOKAI Publication No. H11-39887).

Recently, the technique for storing multivalue data of two bits (four valued) or more bits in one memory cell is developed with an increase in the memory capacity. When multivalue data of, for example, "00", "01", "10", "11" is stored in one memory cell, it is required to more precisely control the threshold voltage of the memory cell in comparison with a case wherein binary data of only "0", "1" is stored. However, in order to precisely adjust the threshold voltage, it is necessary to repeatedly perform the write and verify operations and a long time is required for adjustment in the conventional method for increasing the write voltage in stages. Therefore, since it is contrary to the requirement of enhancing the write operation speed, it becomes important to optimize the write sequence when multivalue data is stored. As a result, it is required to develop a nonvolatile semiconductor memory device which can optimize the multivalue data write sequence.

BRIEF SUMMARY OF THE INVENTION

According to a first aspect of this invention, there is provided a semiconductor memory device comprising a memory cell; a voltage supplying section which supplies control gate voltage to a control gate of the memory cell and supplies drain voltage to a drain of the memory cell when data is written into the memory cell; and a control section which verifies a threshold value of the memory cell after data is written into the memory cell, wherein the voltage supplying section supplies first control gate voltage to the control gate for a first control time period and supplies preset write voltage to the drain for a first write time period which is shorter than the first control time period, starts after start of supply of the first control gate voltage and ends before elapse of the first control time period when a data write operation into the memory cell is started, the voltage supplying section supplies second control gate voltage obtained by raising the first control gate voltage by constant voltage to the control gate for a second control time period which is shorter than the first control time period and supplies the preset write voltage to the drain for a second write time period which is shorter than the first write time period, starts after start of supply of the second control gate voltage and ends before elapse of the second control time period in a case where it is detected that a data amount written in the memory cell is insufficient as the result of a first verify operation by the control section, and the voltage supplying section supplies third control gate voltage obtained by raising the second control gate voltage by the constant voltage to the control gate for the second control time period and supplies the preset write voltage to the drain for the second write time period in a case where it is detected that a data amount written in the memory cell is insufficient as the result of a second verify operation by the control section.

According to a second aspect of this invention, there is provided a semiconductor memory device comprising a memory cell; a voltage supplying section which supplies control gate voltage to a control gate of the memory cell and supplies drain voltage to a drain of the memory cell when data is written into the memory cell; a control section which verifies a threshold value of the memory cell after data is written into the memory cell; and a counter section which counts the number of write operations, wherein the voltage supplying section supplies first control gate voltage to the control gate for a first control time period and supplies preset write voltage to the drain for a first write time period which is shorter than the first control time period, starts after start of supply of the first control gate voltage and ends before elapse of the first control time period when a data write operation into the memory cell is started, the voltage supplying section repeatedly performs a write operation of generating and supplying the first control gate voltage to the control gate for a second control time period which is shorter than the first control time period and generating and supplying the write voltage to the drain for a second write time period which is shorter than the first write time period in a case where it is detected that a data amount written in the memory cell is insufficient and a count value of the counter section is not larger than a specified value as the result of a verify operation by the control section, and the voltage supplying section repeatedly performs a write operation of generating and supplying second control gate voltage obtained by raising the first control gate voltage by constant voltage to the control gate for the second control time period and generating and supplying the write voltage to the drain for the second write time period when the count value of the counter section has reached the specified value, thereby to set a threshold voltage distribution range which is smaller than an increase amount of the first and second control gate voltages.

According to a third aspect of this invention, there is provided a semiconductor memory device comprising a memory cell; a voltage supplying section which supplies control gate voltage to a control gate of the memory cell and supplies drain voltage to a drain of the memory cell when data is written into the memory cell; a control section which verifies a threshold value of the memory cell after data is written into the memory cell; and a counter section which counts the number of write operations, wherein the voltage supplying section supplies first control gate voltage to the control gate for a first control time period and supplies preset write voltage to the drain for a first write time period which is shorter than the first control time period, starts after start of supply of the first control gate voltage and ends before elapse of the first control time period when a data write operation into the memory cell is started, the voltage supplying section repeatedly performs a write operation of generating and supplying second control gate voltage obtained by raising the first control voltage by constant voltage to the control gate for a second control time period which is shorter than the first control time period and generating and supplying the write voltage to the drain for a second write time period which is shorter than the first write time period in a case where it is detected that a data amount written in the memory cell is insufficient and a count value of the counter section is not larger than a specified value as the result of a verify operation by the control section, and the voltage supplying section repeatedly performs an operation of generating and supplying third control gate voltage which is lower than second control gate voltage at the time of a preceding write operation to the control gate of the memory cell for the second control time period and generating and supplying the write voltage to the drain for the second write time period when the count value of the counter section has reached the specified value, thereby to control and set the threshold voltage of the memory cell by use of voltage which is lower than the constant voltage.

DETAILED DESCRIPTION OF THE INVENTION

There will now be described embodiments of this invention with reference to the accompanying drawings.

Figure 2:
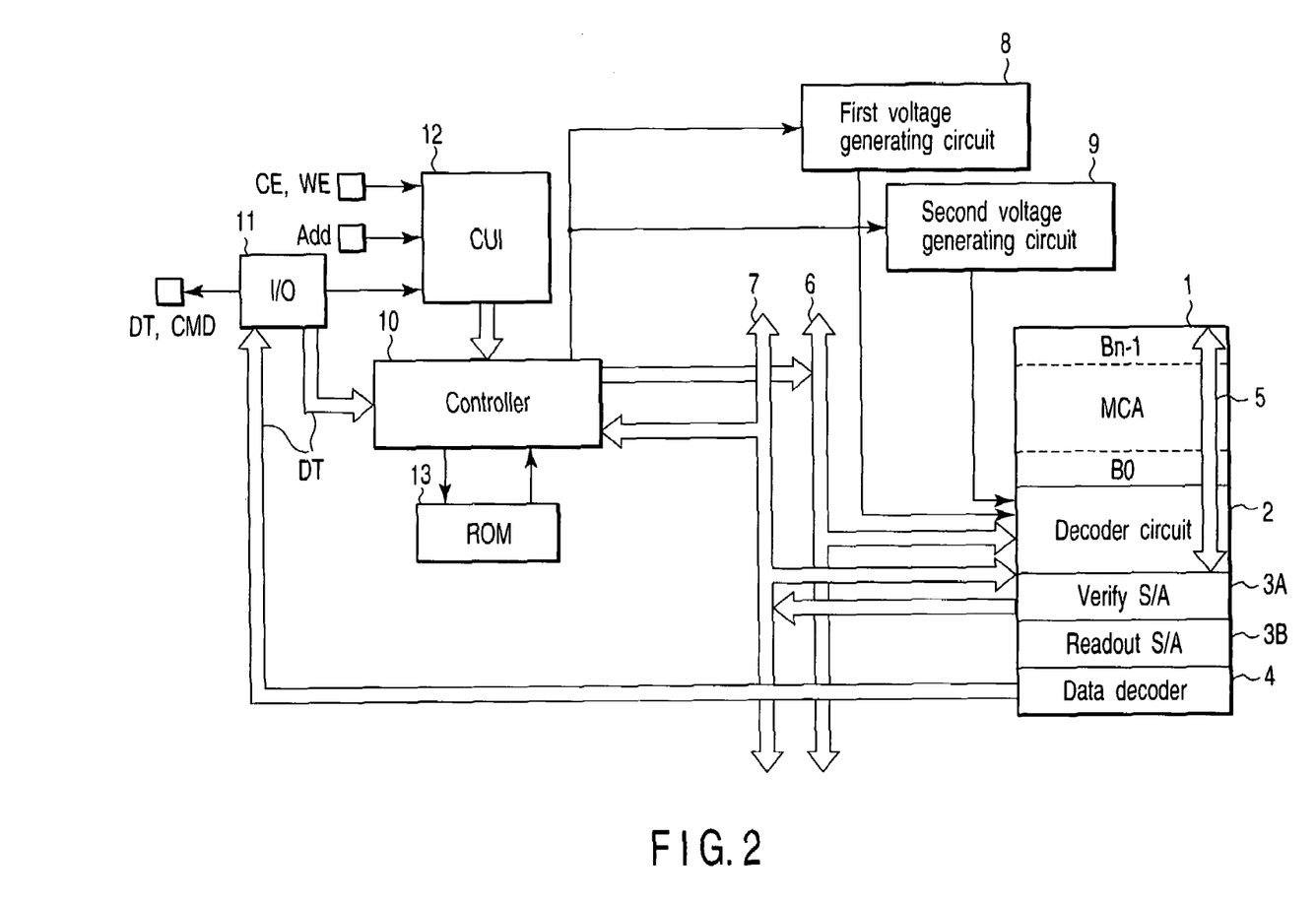
FIG. 2 is a configuration diagram schematically showing a flash memory.

First, the schematic configuration of a flash memory which stores multivalue data and is applied to a first embodiment is explained with reference to FIGS. 2, 3 and 4. As shown in FIG. 2, a memory cell array (MCA) 1 has n blocks B0 to Bn−1. Each of the blocks B0 to Bn−1 is a minimum unit for data erase. The memory cell array 1 includes a decoder circuit 2 which selects a memory cell, verify sense amplifier (S/A) 3A, readout sense amplifier (S/A) 3B and data decoder 4. Further, a data line 5 is commonly arranged for the blocks B0 to Bn−1 of the memory cell array 1.

The decoder circuit 2 is connected to an address bus line 6 and selects a word line (row line) and bit line (column line) according to an address signal supplied from a controller 10 to select a memory cell.

An input ends of the verify sense amplifier 3A and readout sense amplifier 3B are connected to the data line 5. The verify sense amplifier 3A and readout sense amplifier 3B each have a reference current generating circuit using at least one reference cell to generate, for example, three reference currents as will be described later when 2-bit data of four values, for example, is stored in the memory cell. The sense amplifiers 3A, 3B each compare the reference current supplied from the reference current generating circuit with the current flowing through the selected memory cell.

An output end of the verify sense amplifier 3A is connected to a data bus line 7, and it detects a signal read out from the memory cell at the data write time or erase time and supplies the same to the controller 10. An output end of the readout sense amplifier 3B is connected to the data decoder 4. The data decoder 4 decodes a signal supplied from the readout sense amplifier 3B to generate an output signal. An output end of the data decoder 4 is connected to an input/output section (I/O) 11 and a signal output from the data decoder 4 at the data readout time is output to the exterior via the input/output section 11.

The address bus line 6 and data bus line 7 are connected to the controller 10. The controller 10 is connected to the input/output section 11, CUI (Command User Interface) 12, ROM 13 and first and second voltage generating circuits 8, 9. The input/output section 11 supplies a command CMD supplied from the exterior to the CUI 12 and supplies write data of the memory cell to the controller 10. Further, the input/output section 11 outputs readout data supplied from the readout sense amplifier 3B to the exterior.

Further, the CUI 12 receives signals such as a chip enable signal CE and a write enable signal WE input from the exterior and an address signal Add, processes the above signals and supplies the thus processed signals to the controller 10. In the ROM 13, various programs used to control the operation of the controller 10 are stored. The controller 10 controls the whole operation of the flash memory according to the command CMD and programs. That is, the address signal is supplied to the address bus line 6 and write data is supplied to the data bus line 7. Further, the controller 10 controls the first and second voltage generating circuits 8, 9 at the data write time, verify time, readout time and erase time to generate preset voltages. The first voltage generating circuit 8 generates voltage applied to the control gate of the memory cell, that is, the word line voltage at the data write time, verify time and readout time. The word line voltage is supplied to a word line via a row main decoder and row pre-decoder which will be described later in the decoder circuit 2. Further, the second voltage generating circuit 9 generates a drain voltage supplied to a drain of the memory cell at the data write time. The drain voltage is supplied to the drain of the memory cell via a column pre-decoder and column gate of the decoder circuit 2.

Figure 3:
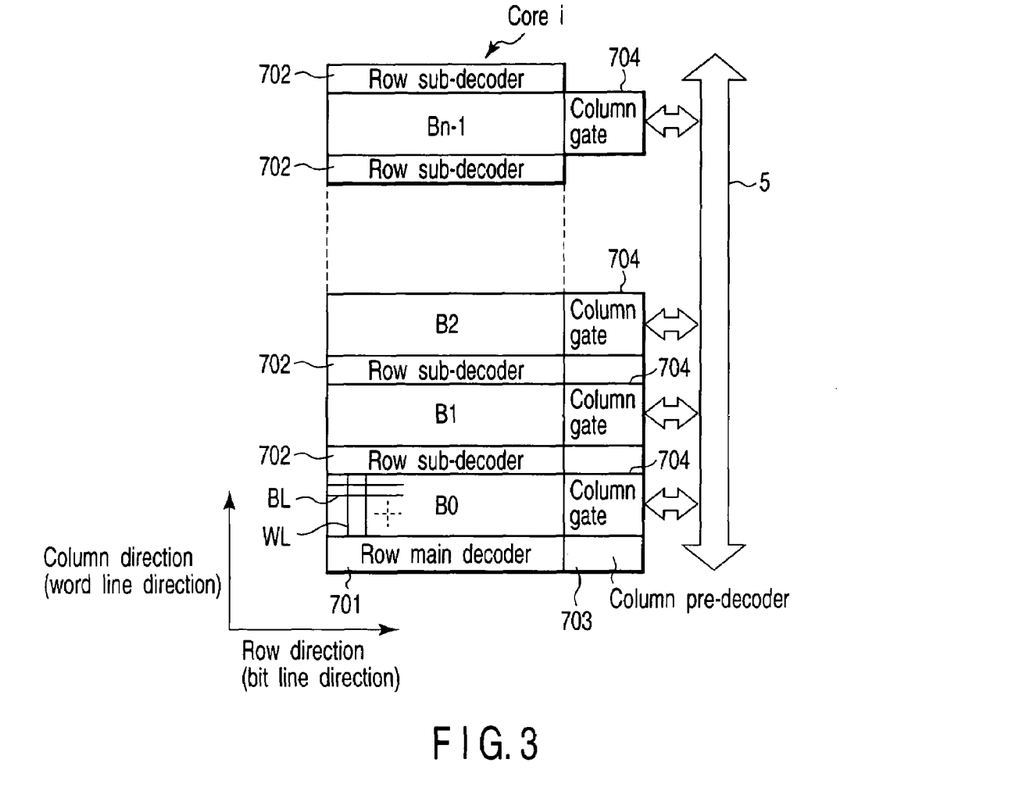
FIG. 3 is a configuration diagram schematically showing a core portion of FIG. 2.

FIG. 3 shows the configuration of the memory cell array 1. A row main decoder 701 which selects one of word lines WL is arranged in the end portion of an array of the blocks B0 to Bn−1 and row sub decoders 702 which select blocks are arranged between respective blocks. A column decoder is arranged in the end portion of the bit lines BL of the blocks B0 to Bn−1 and is configured by a column pre-decoder 703 and column gates 704 which select the bit lines BL. The column gates 704 are connected to the data line 5. The row main decoder 701 and column pre-decoder 703 are arranged in the decoder circuit 2 shown in FIG. 2.

Figure 4:
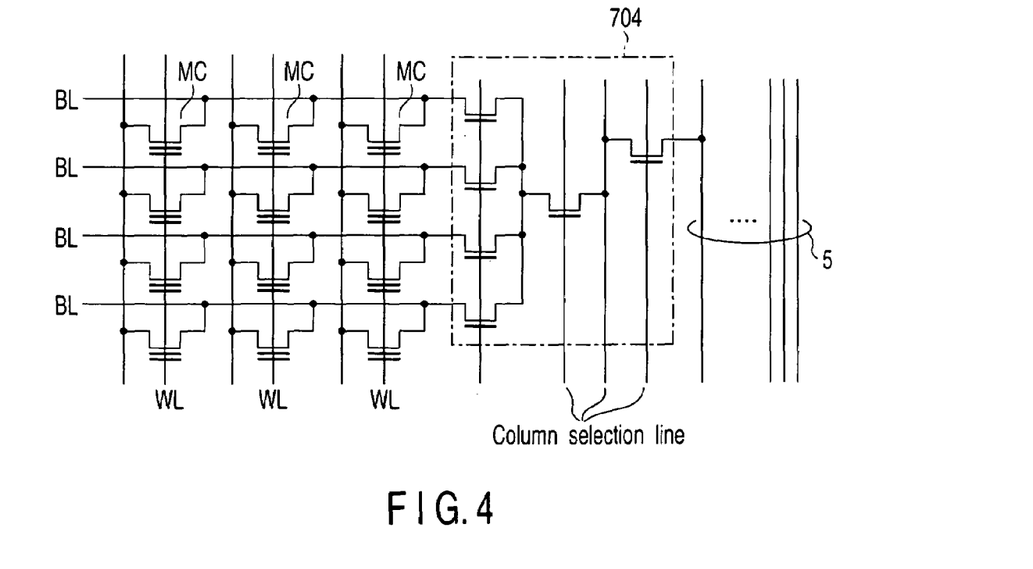
FIG. 4 is a circuit diagram schematically showing the block configuration of FIG. 2.

FIG. 4 shows the configuration of each of the blocks B0 to Bn−1. As shown in FIG. 4, the flash memory is a NOR type flash memory, for example, a plurality of bit lines BL and a plurality of word lines WL are arranged to intersect each other and memory cells MC are arranged on the intersecting portions of the bit lines BL and the word lines WL. For example, the memory cell MC is configured by an EEPROM cell. A drain of the memory cells MC arranged on each column is connected to a corresponding one of the bit lines BL, a control gate of the memory cells MC arranged on each row is connected to a corresponding one of the word lines WL, and the sources thereof are connected to a common source line.

FIRST EMBODIMENT

Next, the operation of writing multivalue data by use of the above flash memory is explained.

Figure 5:
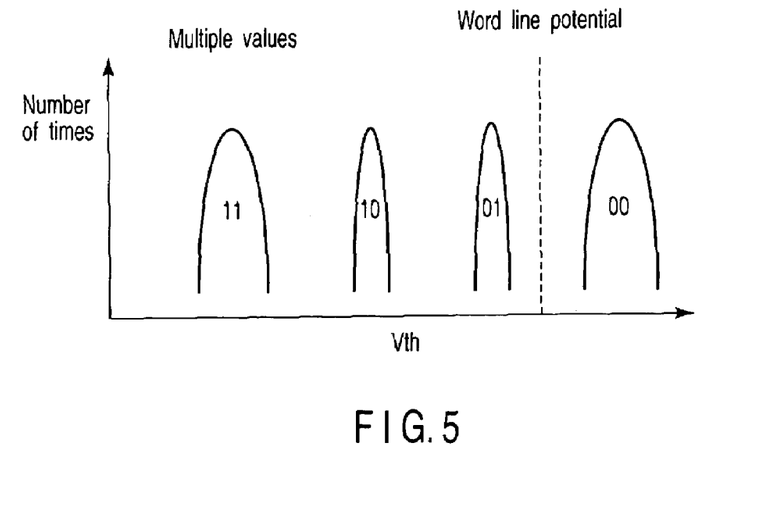
FIG. 5 is a diagram showing threshold voltages of a memory cell which stores 4-valued data.

As shown in FIG. 5, threshold voltages corresponding to data items "11", "10", "01" are set in a range of voltages lower than the word line potential at the readout time and threshold voltage corresponding to data "00" is set in a range of voltages higher than the word line potential in the case of a memory cell which stores 4-valued data, for example. Thus, since it is necessary to set a plurality of threshold voltages in a range of voltages lower than the word line potential, it is required to precisely control the threshold voltage when multivalue data is stored.

Figure 6:
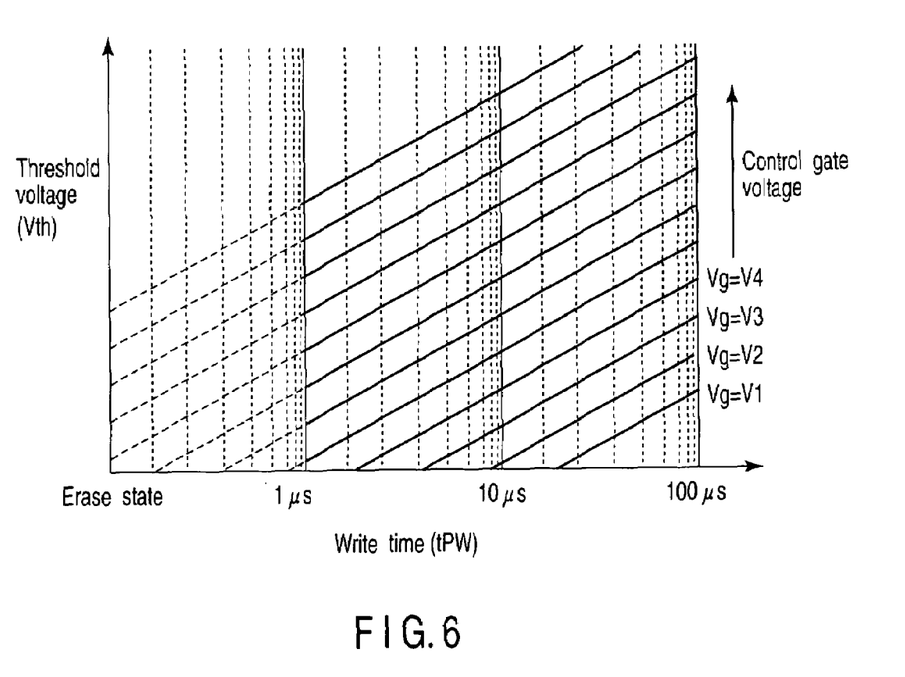
FIG. 6 is a diagram showing the write characteristic of a memory cell.

FIG. 6 shows the write characteristic of a flash memory when the threshold voltage is raised by applying write voltages to the control gate and drain of the memory cell set in the erase state and injecting accelerated hot electrons into the floating gate. As is clearly understood from FIG. 6, the threshold voltage Vth of the memory cell depends on the voltage Vg applied to the control gate and varies in proportion to the logarithm of application time of the drain voltage if the voltage applied to the drain is kept constant.

Figure 7:
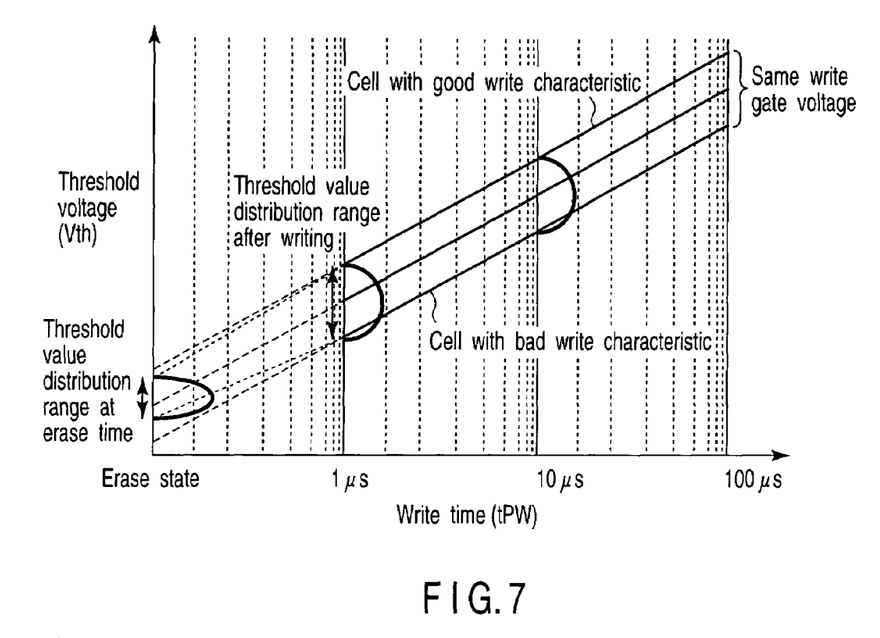
FIG. 7 is a diagram showing a state in which the threshold voltage of the memory cell varies.

However, as shown in FIG. 7, the characteristics of the respective memory cells are not constant and the threshold voltages of the memory cells set in the erase state are distributed in a preset range. In this state, if the write operation is performed, the threshold voltage distribution is changed to threshold voltage distribution corresponding to the write characteristic of the memory cell. The threshold voltage distribution after the write operation does not substantially depend on the threshold voltage distribution in the erase state and is determined by the write characteristic of the memory cell. This is because the threshold voltage distribution at the erase time corresponds to a value which is as small as negligible when it is converted to write time.

Further, since the flash memory is subjected to the simultaneous erase operation in the block unit, data items of the memory cells cannot be independently erased. Therefore, at the write time, particularly, it is necessary to pay much attention so as not to cause excessive writing (over-programming).

Therefore, in the first embodiment, voltage which does not cause the memory cell to be directly set into the excessive writing state is applied to the memory cell at the start time of the write operation. After this, the threshold voltage of the memory cell is verified and then the threshold voltage (which is hereinafter referred to as target threshold voltage) to be set in the memory cell is set by performing the additional write operation for the memory cell in which a written data amount is insufficient.

Figure 1A:
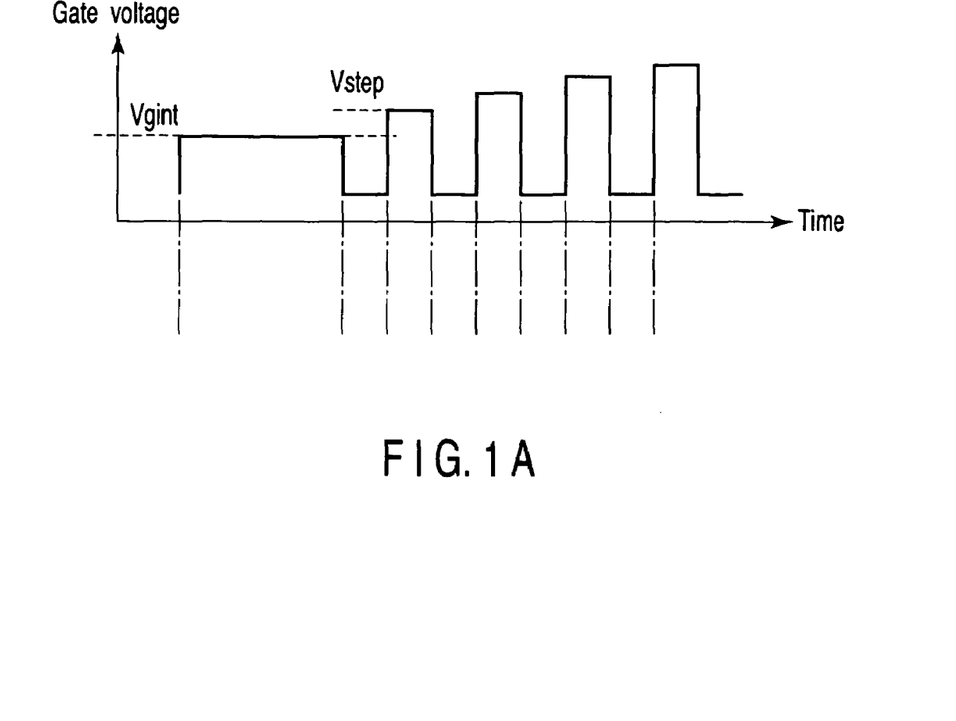
FIGS. 1A and 1B are a waveform diagram showing the write sequence according to a first embodiment of this invention.
Figure 1B:
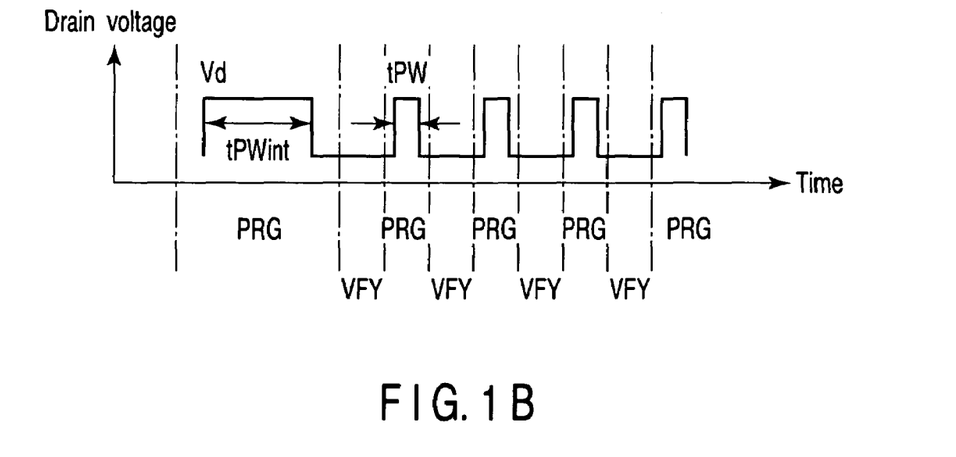
Figure 8:
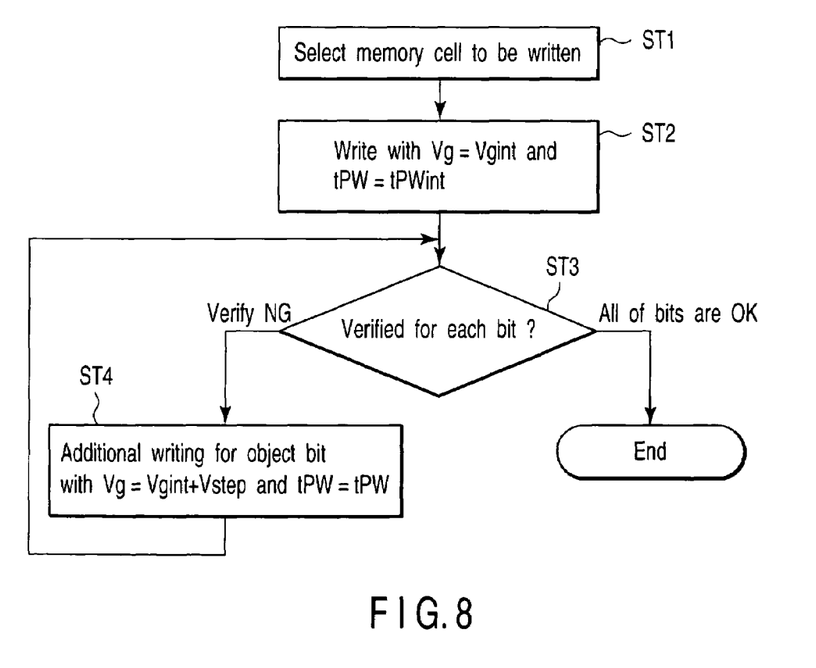
FIG. 8 is a flowchart for illustrating the write operation in the first embodiment.

FIGS. 1A and 1B show the write sequence in the first embodiment and FIG. 8 is a flowchart for illustrating the operation of a write/erase control circuit 15. First, a memory cell to be written is selected (ST1). After this, write voltage is applied to the selected memory cell. In a period from the erase state to the first write operation, initial control gate voltage Vgint approximately equal to voltage which does not cause over-programming is applied to the control gate of the memory cell and constant voltage Vd is applied to the drain for an initial write time period tPWint, for example, several μs (ST2). The initial write time period tPWint is set shorter than time of supply of the gate voltage Vgint. That is, the relation between application time of the drain voltage and application time of the control gate voltage is shown in FIGS. 1A and 1B, the drain voltage is applied after the control gate voltage is applied and then application of the control gate voltage is interrupted after application of the drain voltage is interrupted. The control gate voltage is generated by the first voltage generating circuit 8 and the drain voltage Vd is generated by the second voltage generating circuit 9. The control gate voltage is applied to a selected word line and the drain voltage Vd is applied to a selected bit line.

After this, the threshold voltage is verified for each bit and whether the threshold voltage of the memory cell has reached voltage corresponding to write data or not is determined (ST3). As a result, if it is determined that a written data amount is insufficient, an additional write operation is performed (ST4). At this time, the drain voltage Vd is kept set equal to the initial voltage and the control gate voltage Vg is raised by constant voltage Vstep and set to voltage (Vgint+Vstep). Further, the write time is set to time tPW, for example, 1 μs which is shorter than the initial write time. The voltage is verified again (ST3) after the additional write operation is performed in a condition of the voltage and the write time. As a result, if a memory cell in which a written data amount is still insufficient is provided, the control gate voltage Vg is further raised by the constant voltage Vstep and set to (Vgint+2Vstep) and an additional write operation is performed for the memory cell. The above operation is repeatedly performed until all of the bits are set within the distribution range of the target threshold voltages.

Figure 9:
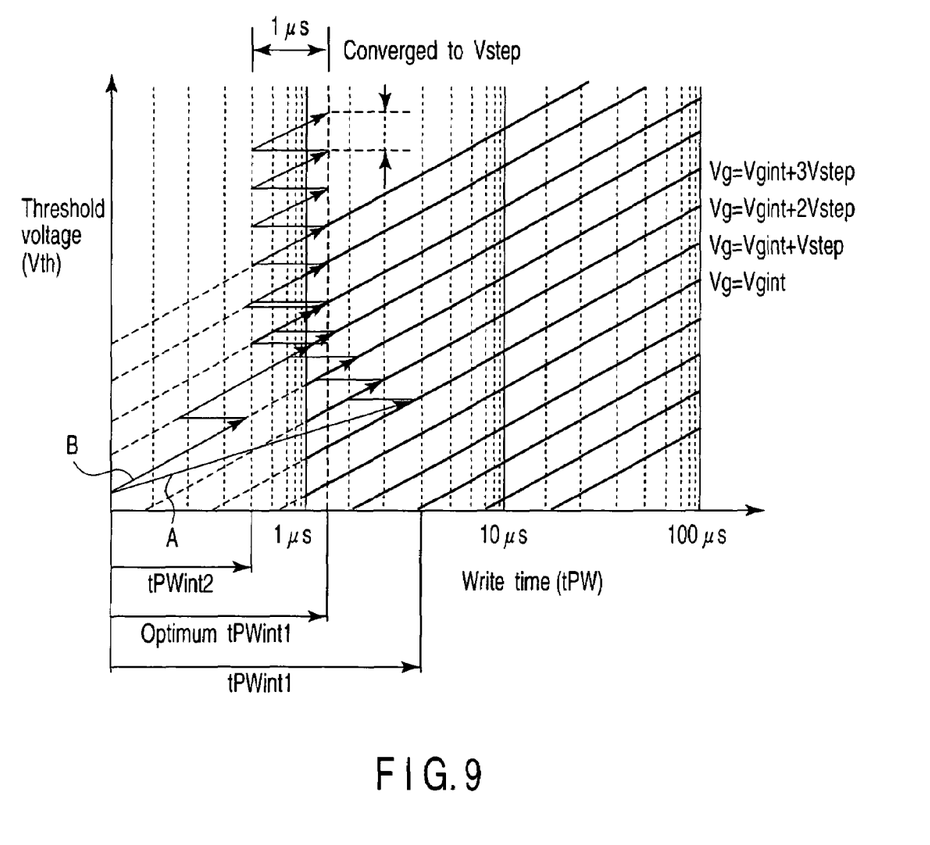
FIG. 9 is a diagram showing a state in which the threshold voltage of a memory cell according to the first embodiment varies.

FIG. 9 shows a variation in the threshold voltage of a memory cell when the write sequence of the first embodiment is repeated. As is clearly understood from FIG. 9, when the write operation corresponding to the initial write time period tPWint and the following write time period tPW is repeatedly performed, a variation in the threshold voltage for one write operation can be converged to the constant voltage Vstep by repeatedly performing the write operation for the initial write time period tPWint or even for a time period tPWint1 which is shorter than the initial write time period tPWint. That is, when the initial write time period is set to tPWint1 which is longer than 1 µs, for example, a variation in the threshold voltage in the next additional write operation is smaller than Vstep and a variation in the threshold voltage is converged to Vstep from performing the next write operation. Further, when the initial write time period is set to tPWint2 which is shorter than 1 µs, for example, a variation in the threshold voltage in the next additional write operation is larger than Vstep and a variation in the threshold voltage is converged to Vstep from performing the next write operation.

When the distribution range of the threshold voltages is larger than the constant voltage Vstep as shown by multivalue data "10", "01" in FIG. 5, for example, the initial write time period tPWint is set longer than 1 µs and the write operation is performed in a condition that a variation in the threshold voltage is smaller than the constant voltage Vstep. However, for example, if the initial write time period tPWint is set excessively longer than 1 µs, the number of additional write operations is increased as shown by an arrow A in FIG. 9 and the write time becomes long. Further, if the initial write time period tPWint is set excessively shorter than 1 µs, a variation in the threshold voltage in the initial period of the additional write operation becomes larger than Vstep as shown by an arrow B in FIG. 9, and therefore, there occurs a possibility that excessive writing occurs. Therefore, the initial write time period tPWint can be optimized by setting the period tPWint near the write time during which a variation in the threshold voltage is converged to the constant voltage Vstep and setting the same slightly longer than the above write time. That is, in the case of FIG. 9, it is preferable to set the initial write time period tPWint to approximately 1.5 µs, for example.

According to the first embodiment, the write operation is performed in the initial write time period by use of the initial control gate voltage (first voltage) Vgint which does not cause over-programming and the initial write time period (first write time) tPWint. Then, if it is detected that a written data amount is insufficient as the verify result, a variation in the threshold voltage for each write operation can be set to the constant voltage Vstep by repeatedly performing the write operation by use of voltage obtained by raising the first voltage Vgint by the constant voltage Vstep and rewrite time (second write time) tPW which is shorter than the first write time tPWint. Thus, since a variation in the threshold voltage for each write operation is made constant, it becomes possible to control and set the distribution range of threshold voltages narrow in a case where the threshold voltage is required to be controlled with high precision, for example, when multivalue data is written.

Further, the number of write operations can be reduced by setting the initial write time near the rewrite time. Therefore, it becomes possible to set required threshold voltage in the memory cell at high speed.

SECOND EMBODIMENT

Figure 10:
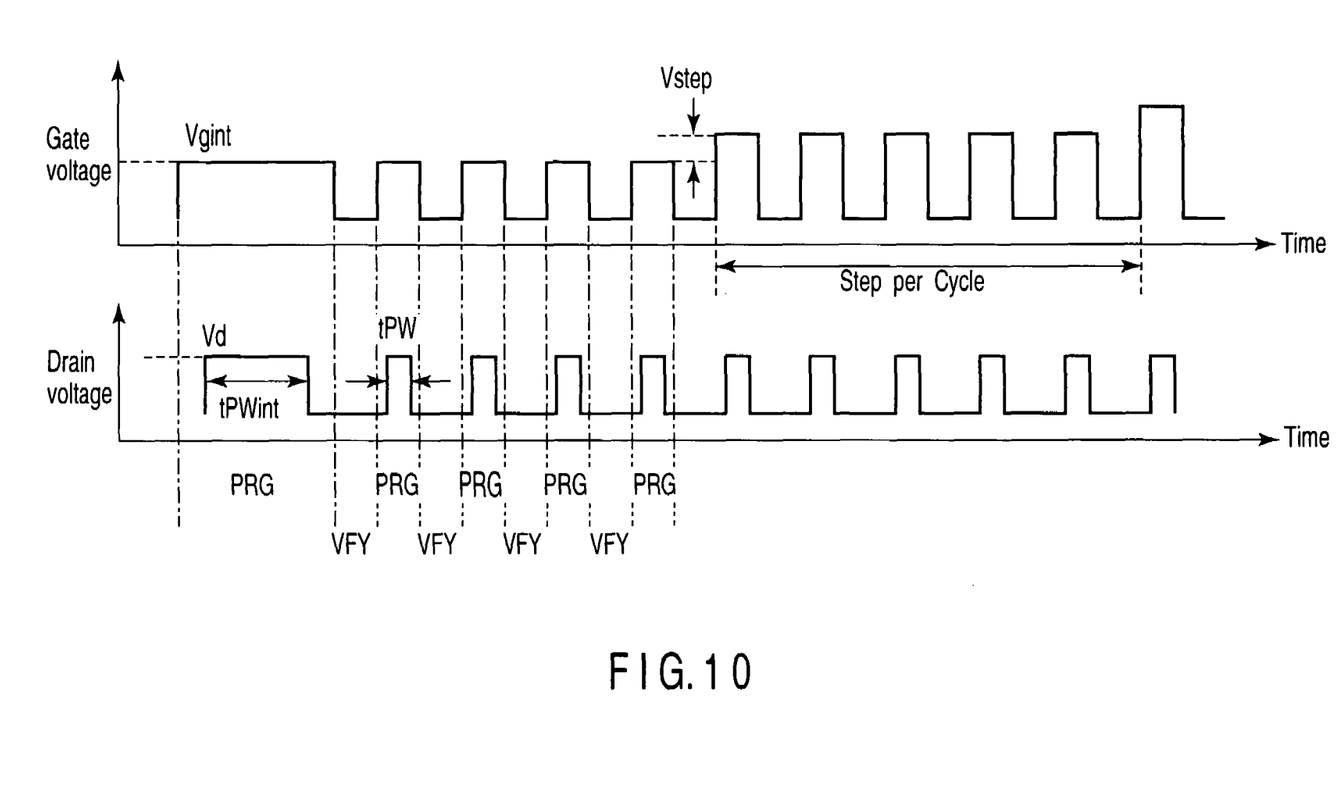
FIG. 10 is a waveform diagram showing the write sequence according to a second embodiment of this invention.
Figure 11:
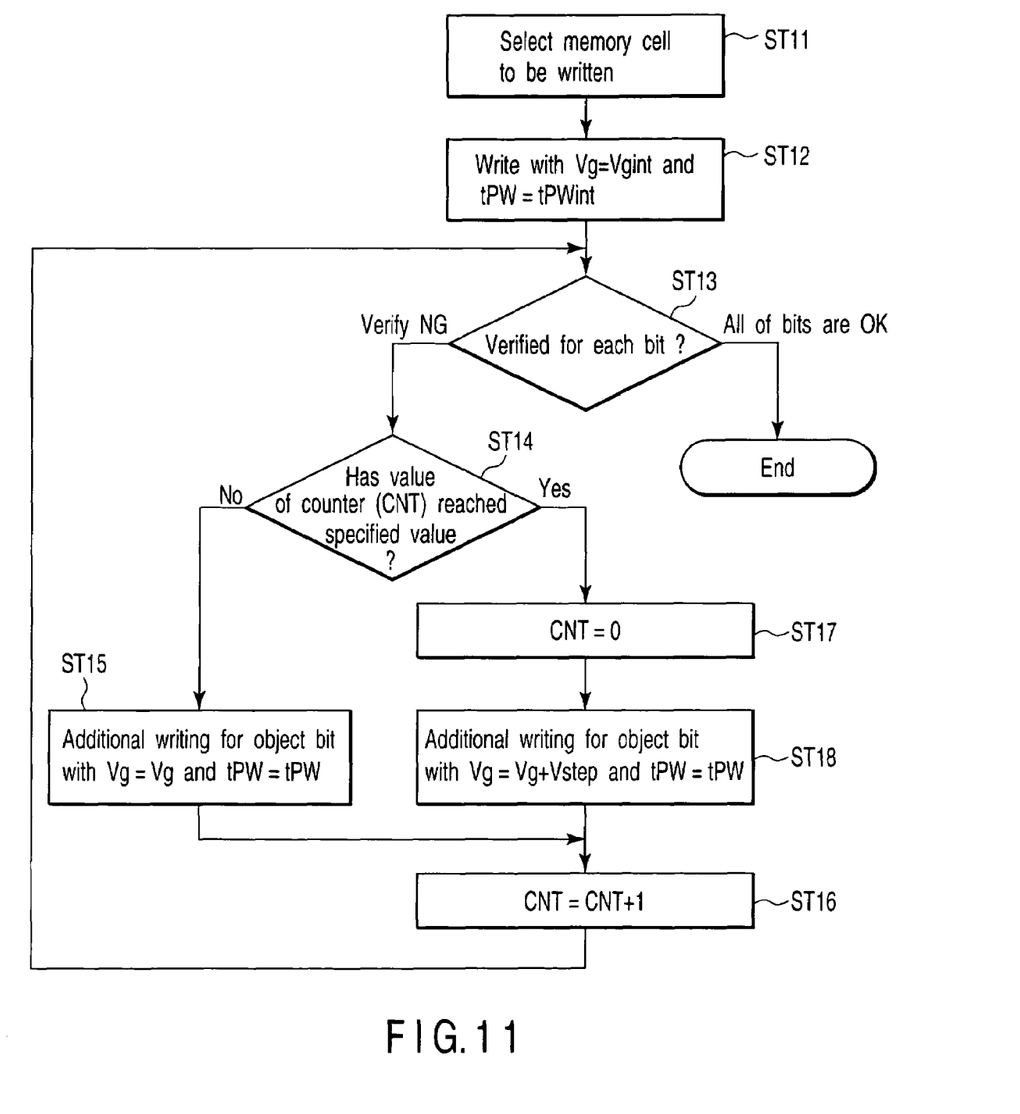
FIG. 11 is a flowchart for illustrating the write operation in the second embodiment.
Figure 12:
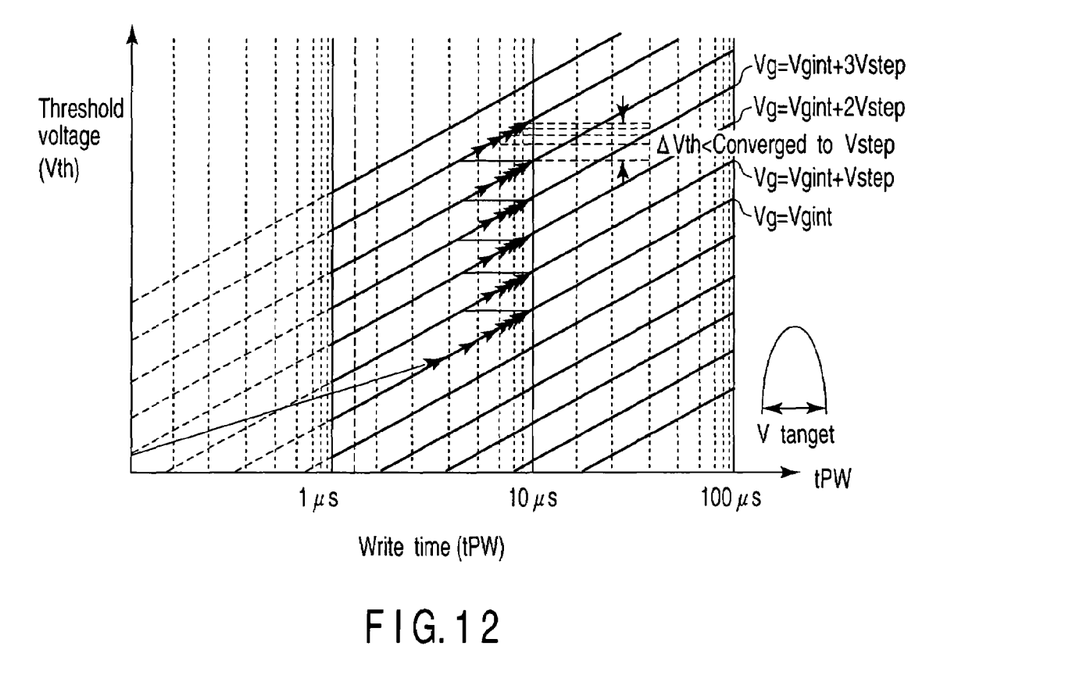
FIG. 12 is a diagram showing a state in which the threshold voltage of a memory cell according to the second embodiment varies.

FIG. 10 shows the write sequence according to a second embodiment of this invention, FIG. 11 is a flowchart of the write sequence and FIG. 12 shows a variation in the threshold voltage of a memory cell. In the first embodiment, the additional write operation is performed by use of voltage obtained by raising the initial control gate voltage Vg by constant voltage Vstep for each write operation. On the other hand, in the second embodiment, the write sequence which is preferable when the distribution range of threshold voltages of multivalue data is smaller than the constant voltage Vstep is shown.

If the additional write operation is performed in the condition shown in the first embodiment when the distribution range of threshold voltages of multivalue data is smaller than the constant voltage Vstep, a variation in the threshold voltage is converged to the constant voltage Vstep, and as a result, over-programming occurs.

Therefore, as shown in FIGS. 10, 11, in the second embodiment, the initial write time period tPWint is set to, for example, several µs, the write operation is started and then the additional write operation is performed several times without changing the control gate voltage Vg. If the problem that a written data amount is insufficient is not solved by the above write operation, the control gate voltage Vg is raised by the constant voltage Vstep and the additional write operation is performed several times.

Next, the operation of the second embodiment is explained below in detail. First, a memory cell to be written is selected (ST11). Then, like the first embodiment, initial control gate voltage Vgint and drain voltage Vd are set, an initial write time period tPWint is set to, for example, several us which is slightly longer than the time period set in the first embodiment and then the write operation is started (ST12). After this, the threshold voltage is verified for each bit and whether the threshold voltage of the memory cell has reached voltage corresponding to write data or not is determined (ST13). As a result, if it is detected that a written data amount is insufficient, whether the count value of a counter (CNT) which counts the number of write operations has reached a specified value or not is determined (ST14). As a result, if it is determined that the count value does not reach the specified value, the additional write operation is performed without changing the control gate voltage Vg, write time tPW and drain voltage Vd (ST15). After this, the count value of the counter (CNT) is incremented (ST16) and the threshold voltage of the memory cell is verified again (ST13). As a result, if it is detected that a written data amount is insufficient, whether the count value of the counter (CNT) has reached the specified value or not is determined (ST14). As a result, if it is determined that the count value has reached the specified value, the count value of the counter (CNT) is initialized (ST17). After this, the control gate voltage Vg is raised by the constant voltage Vstep and the additional write operation is performed without changing the write time tPW and drain voltage Vd (ST18). After this, the count value is incremented (ST16) and the threshold voltage of the memory cell is verified again (ST13). The above additional write operation is repeatedly performed until all of the bits are set within the range of the target threshold voltages.

In this case, the relation between the constant voltage Vstep and a variation $\Delta Vth$ in the threshold voltage of the memory cell for each of s write operations (s is a natural number equal to or larger than 1), for example, is expressed by the following equation.

$$\sum_{n=1}^{s} \Delta Vth(n) = Vstep$$

Further, when the target threshold voltage (the distribution range of the target threshold voltages shown in FIG. 12) is expressed by Vtarget, the relation between the target threshold voltage Vtarget and the variation ΔVth in the threshold voltage is expressed by the following expression.

$$\int_{n=1}^{s} \Delta Vth(n) \leq Vtarget$$

The relation between the target threshold voltage Vtarget and the variation ΔVth in the threshold voltage can also be expressed by the following expression.

$$\Delta Vth(1), \ldots, \Delta Vth(s-1), \Delta Vth(s) \leq Vtarget$$

Thus, the total value of variations in the threshold voltages of the memory cell by performing the write operation s times becomes equal to Vstep and the variation ΔVth(n) in the threshold voltage for each is write operation is set smaller than the target threshold voltage Vtarget. Therefore, the threshold voltage of the memory cell can be precisely set without exceeding Vtarget in each additional write operation.

According to the second embodiment, if the threshold voltage of the memory cell does not reach the preset threshold voltage for every preset number of write operations, the control gate voltage Vg is increased by the constant voltage Vstep and the rewrite operation is performed without increasing the control gate voltage Vg in the write operations of a number less than the above preset number. Therefore, as shown in FIG. 12, since the threshold voltage can be set by use of voltage which is lower than the constant voltage Vstep, the threshold voltage can be controlled more precisely in comparison with the first embodiment.

Also, in the second embodiment, if the initial write time period tPWint is set excessively long, the number of additional write operations is increased and the write time is elongated. Therefore, the write sequence can be optimized by setting the additional write time period tPWint near the write time in which a variation in the threshold voltage is converged.

THIRD EMBODIMENT

Figure 13:
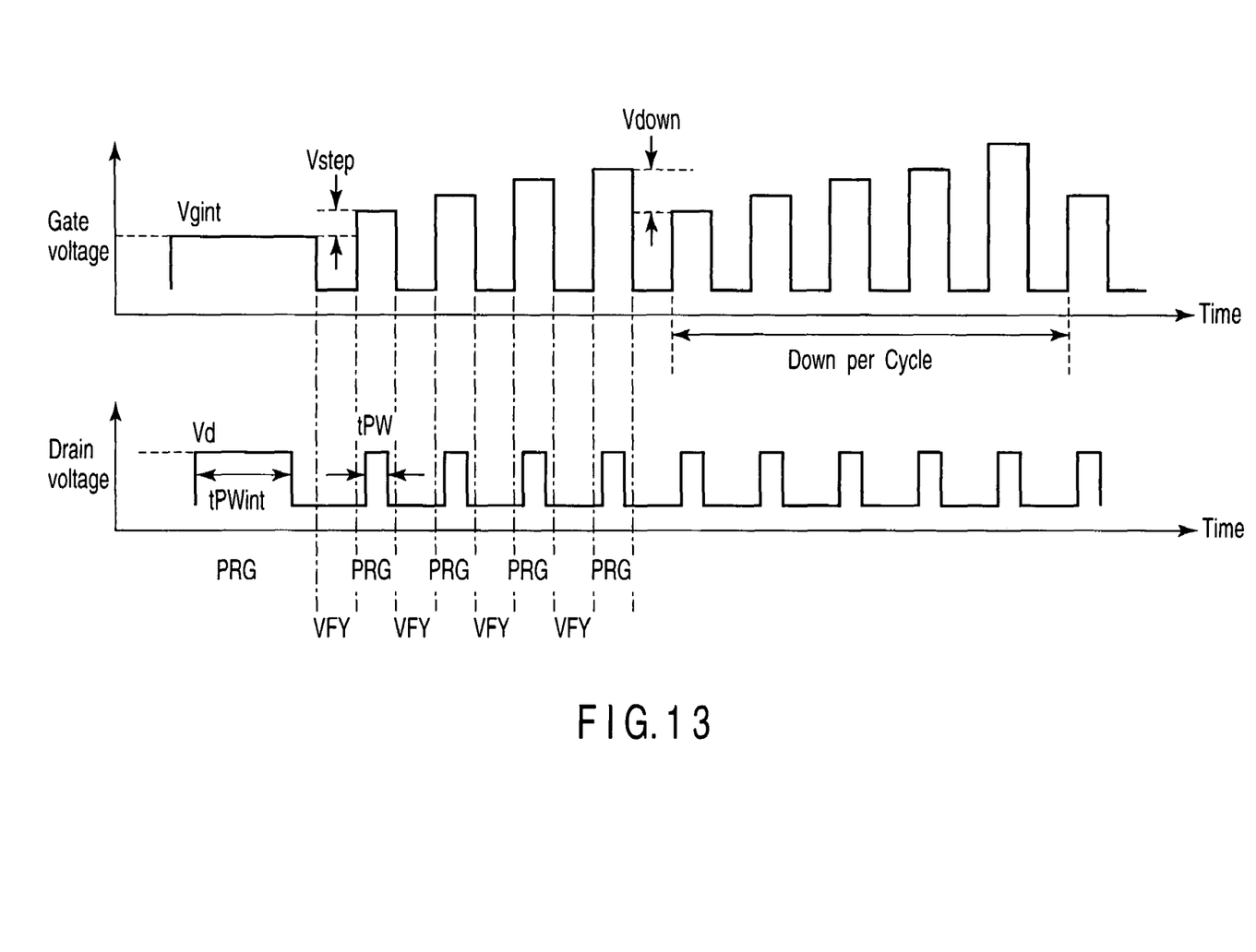
FIG. 13 is a waveform diagram showing the write sequence according to a third embodiment of this invention.
Figure 14:
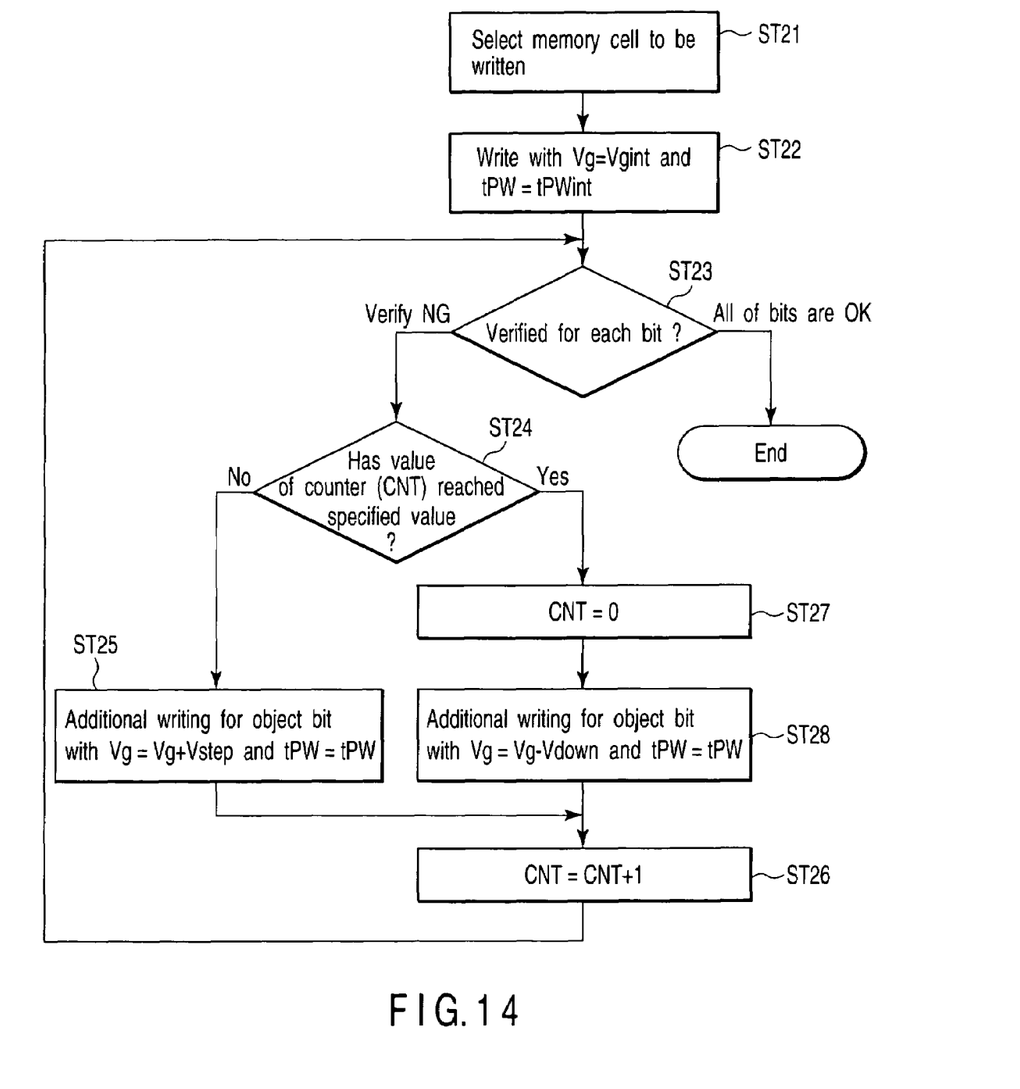
FIG. 14 is a flowchart for illustrating the write operation in the third embodiment.
Figure 15:
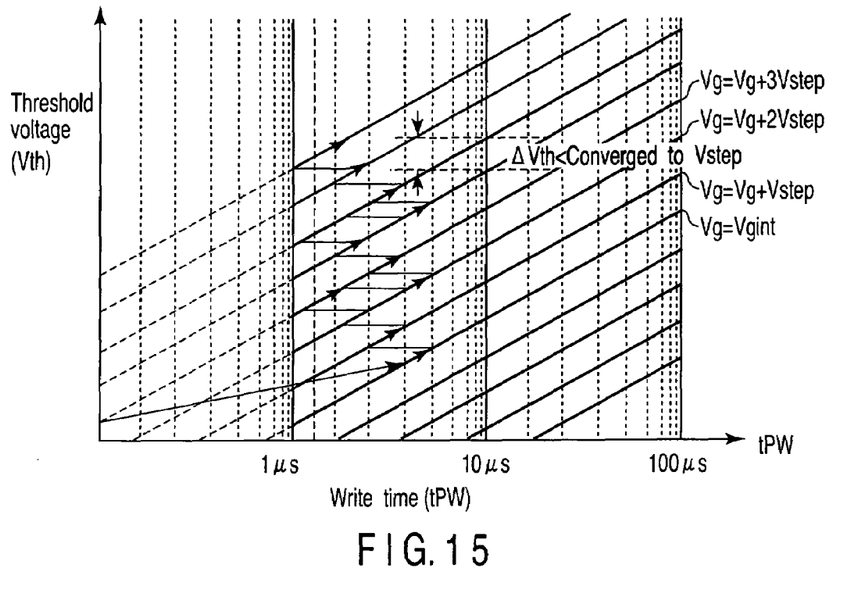
FIG. 15 is a diagram showing a state in which the threshold voltage of a memory cell according to the third embodiment varies.

FIGS. 13, 14 and 15 show a third embodiment and show a write sequence when the distribution range of threshold voltages of multivalue data is smaller than constant voltage Vstep as in the second embodiment.

As shown in FIG. 13, like the first embodiment, the additional write operation is performed by raising the control gate voltage by the constant voltage Vstep at a time after initial write time period tPWint. However, in the third embodiment, a variation in the threshold voltage is suppressed to a small value again by performing the rewrite operation by lowering the control gate voltage to initial control gate voltage Vgint after a preset number of additional write operations are performed.

Next, the operation of the third embodiment is explained with reference to FIGS. 13, 14.

First, a memory cell to be written is selected (ST21). After this, like the first embodiment, initial control gate voltage Vgint and drain voltage Vd are set, initial write time period tPWint is set to, for example, several us and then the write operation is performed (ST22). After this, the threshold voltage is verified for each bit and whether the threshold voltage of the memory cell has reached voltage corresponding to write data or not is determined (ST23). As a result, if it is determined that a written data amount is insufficient, whether the count value of a counter (CNT) which counts the number of write operations has reached a specified value or not is determined (ST24). As a result, if it is determined that the count value does not reach the specified value, the control gate voltage Vg is raised by the constant voltage Vstep and the additional write operation is performed without changing the write time tPW and drain voltage Vd (ST25). After this, the count value of the counter (CNT) is incremented (ST26) and the threshold voltage of the memory cell is verified again (ST23). As a result, if it is detected that a written data amount is insufficient, whether the count value of the counter (CNT) has reached the specified value or not is determined (ST24). As a result, if it is determined that the count value has reached the specified value, the count value of the counter (CNT) is initialized (ST27). After this, the control gate voltage Vg is lowered by constant voltage Vdown. The initial control gate voltage of a write cycle next to a cycle in which the control gate voltage is lowered by the constant voltage Vdown is set slightly higher than the initial control gate voltage of the preceding write cycle. That is, for example, if the initial control gate voltage of the preceding write cycle is Vgint, the initial control gate voltage of the next write cycle is set to (Vgint+Vstep), for example, and the initial control gate voltage of a write cycle after the above next write cycle is set to (Vgint+2Vstep), for example.

Further, the write time tPW and drain voltage Vd are not changed. In this condition, the next additional write operation is performed (ST28). After this, the count value is incremented (ST26) and the threshold voltage of the memory cell is verified again (ST23). The above additional write operation is repeatedly performed until all of the bits are set within the range of the target threshold voltages.

In this case, for example, the relation between the variation ΔVth in the threshold voltage of the memory cell in each of the s additional write operations, the target threshold voltage Vtarget and the constant voltage Vstep is expressed by the following expression.

$$\Delta Vth(1), \ldots, \Delta Vth(s-1), \Delta Vth(s) \leq Vtarget < Vstep$$

Thus, the variation ΔVth(n) in the threshold voltage for each write operation is set smaller in comparison with the target threshold voltage Vtarget and Vstep in the s additional write operations.

Therefore, in each additional write operation, the threshold voltage of the memory cell can be precisely set without exceeding Vtarget.

According to the third embodiment, if the threshold voltage does not reach preset voltage corresponding to write data, the control gate voltage Vg is raised by the constant voltage Vstep at a time and then the additional write operation is performed. When the number of additional write operations reaches a specified value, the control gate voltage Vg is lowered by the constant voltage Vdown and then the additional write operation is performed again. Therefore, as shown in FIG. 15, a variation in the threshold voltage Vth is not converged to the constant voltage Vstep and the threshold voltage varies in a range smaller than Vstep. Thus, the threshold voltage of the memory cell can be adjusted with high precision by use of voltage lower than the constant voltage Vstep.

Figure 16:
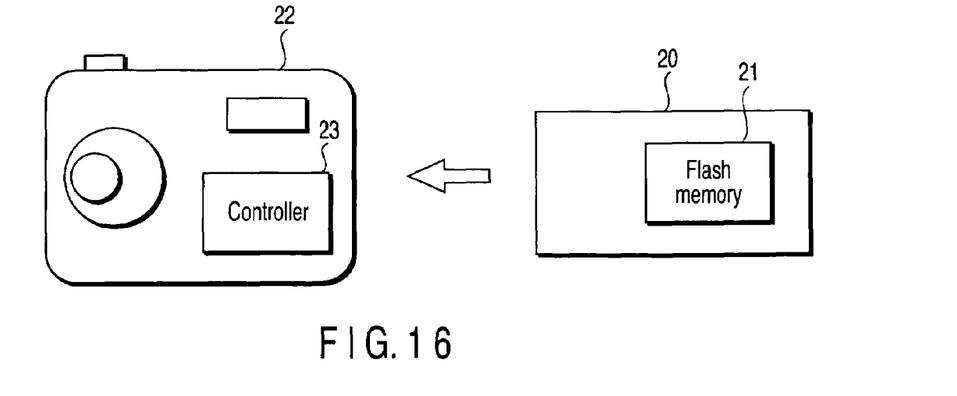
FIG. 16 is a view showing an example of an application to which each embodiment is applied.

FIG. 16 show an example of an application in which the above embodiments are applied. FIG. 16 shows a memory card 20 which is attached with a flash memory 21. The memory card 20 is connected to, for example, a digital still camera 22. The digital still camera 22 has a controller 23 as a host system. The flash memory 21 operates in accordance with a command and an address signal output from the controller 23. A device on the host side is not limited to a digital still camera, and various devices such as mobile phones, readers/writers of memory cards or the like can be applied thereto. Further, The memory card may includes controller. In the case, the controller in the memory card 20 functions as the host system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell;
   a voltage supplying section which supplies control gate voltage to a control gate of the memory cell and supplies drain voltage to a drain of the memory cell when data is written into the memory cell; and
   a control section which verifies a threshold value of the memory cell after data is written into the memory cell,
   wherein the voltage supplying section supplies first control gate voltage to the control gate for a first control time period and supplies preset write voltage to the drain for a first write time period which is shorter than the first control time period, starts after start of supply of the first control gate voltage and ends before elapse of the first control time period when a data write operation into the memory cell is started,
   the voltage supplying section supplies second control gate voltage obtained by raising the first control gate voltage by constant voltage to the control gate for a second control time period which is shorter than the first control time period and supplies the preset write voltage to the drain for a second write time period which is shorter than the first write time period, starts after start of supply of the second control gate voltage and ends before elapse of the second control time period in a case where it is detected that a data amount written in the memory cell is insufficient as the result of a first verify operation by the control section, and
   the voltage supplying section supplies third control gate voltage obtained by raising the second control gate voltage by the constant voltage to the control gate for the second control time period and supplies the preset write voltage to the drain for the second write time period in a case where it is detected that a data amount written in the memory cell is insufficient as the result of a second verify operation by the control section.

2. The device according to claim 1, wherein the first write time period is set near a write time period in which a variation in the threshold voltage of the memory cell is converged to an increased amount of the control gate voltage.

3. The device according to claim 1, wherein the first write time period is longer than the second write time period and is a time period in which a variation in the threshold voltage of the memory cell is set approximately equal to an increased amount of the control gate voltage by the write operation in the second write time period.

4. The device according to claim 1, wherein the memory cell is a NOR type flash memory.

5. The device according to claim 1, wherein the memory cell stores binary data.

6. A semiconductor memory device comprising:
   a memory cell;
   a voltage supplying section which supplies control gate voltage to a control gate of the memory cell and supplies drain voltage to a drain of the memory cell when data is written into the memory cell;
   a control section which verifies a threshold value of the memory cell after data is written into the memory cell, and
   a counter section which counts the number of write operations,
   wherein the voltage supplying section supplies first control gate voltage to the control gate for a first control time period and supplies preset write voltage to the drain for a first write time period which is shorter than the first control time period, starts after start of supply of the first control gate voltage and ends before elapse of the first control time period when a data write operation into the memory cell is started, and
   the voltage supplying section repeatedly performs a write operation of generating and supplying the first control gate voltage to the control gate for a second control time period which is shorter than the first control time period and generating and supplying the write voltage to the drain for a second write time period which is shorter than the first write time period in a case where it is detected that a data amount written in the memory cell is insufficient and a count value of the counter section is not larger than a specified value as the result of a verify operation by the control section, and the voltage supplying section repeatedly performs a write operation of generating and supplying second control gate voltage obtained by raising the first control gate voltage by constant voltage to the control gate for the second control time period and generating and supplying the write voltage to the drain for the second write time period when the count value of the counter section has reached the specified value, thereby to set a threshold voltage distribution range which is smaller than an increase amount of the first and second control gate voltages.

7. The device according to claim 6, wherein the first control gate voltage and the first control time are set near the second write time period in which a variation in the threshold voltage is converged to a range smaller than an increase amount of the above voltage.

8. The device according to claim 6, wherein the relation between the constant voltage Vstep and a variation in the threshold voltage of the memory cell obtained in each of s (s is a natural number not smaller than 1) write operations and expressed by ΔVth is expressed by the following equation:

$$\sum_{n=1}^{s} \Delta Vth(n) = Vstep.$$

9. The device according to claim 6, wherein the relation between target threshold voltage Vtarget and a variation amount ΔVth of the threshold voltage obtained in each of s write operations is expressed by the following expression when a distribution range of threshold voltages to be set in the memory cell is expressed by the target threshold voltage Vtarget:

$$\Delta Vth(1), \ldots, \Delta Vth(s-1), \Delta Vth(s) \leq Vtarget.$$

10. The device according to claim 6, wherein the memory cell is a NOR type flash memory.

11. The device according to claim 10, wherein the memory cell stores binary data.

12. A semiconductor memory device comprising:
a memory cell;
a voltage supplying section which supplies control gate voltage to a control gate of the memory cell and supplies drain voltage to a drain of the memory cell when data is written into the memory cell;
a control section which verifies a threshold value of the memory cell after data is written into the memory cell, and
a counter section which counts the number of write operations,
wherein the voltage supplying section supplies first control gate voltage to the control gate for a first control time period and supplies preset write voltage to the drain for a first write time period which is shorter than the first control time period, starts after start of supply of the first control gate voltage and ends before elapse of the first control time period when a data write operation into the memory cell is started, and
the voltage supplying section repeatedly performs a write operation of generating and supplying second control gate voltage obtained by raising the first control voltage by constant voltage to the control gate for a second control time period which is shorter than the first control time period and generating and supplying the write voltage to the drain for a second write time period which is shorter than the first write time period in a case where it is detected that a data amount written in the memory cell is insufficient and a count value of the counter section is not larger than a specified value as the result of a verify operation by the control section, and the voltage supplying section repeatedly performs an operation of generating and supplying third control gate voltage which is lower than second control gate voltage at the time of a preceding write operation to the control gate of the memory cell for the second control time period and generating and supplying the write voltage to the drain for the second write time period when the count value of the counter section has reached the specified value, thereby to control the threshold voltage of the memory cell by use of voltage which is lower than the constant voltage.

13. The device according to claim 12, wherein the third control voltage is voltage which is higher than the first control gate voltage.

14. The device according to claim 12, wherein the third control voltage is voltage which is higher than the first control gate voltage and lower than the second control gate voltage.

15. The device according to claim 12, wherein the relation between target threshold voltage Vtarget and a variation amount $\Delta$Vth of the threshold voltage obtained in each of s write operations is expressed by the following expression when a distribution range of threshold voltages to be set in the memory cell is expressed by the target threshold voltage Vtarget:

$$\Delta Vth(1), \ldots, \Delta Vth(s-1), \Delta Vth(s) \leq V\text{target}$$

16. The device according to claim 12, wherein the memory cell is a NOR type flash memory.

17. The device according to claim 16, wherein the memory cell stores binary data.

18. A memory card including the semiconductor memory device according to claim 1.

19. A memory card including the semiconductor memory device according to claim 6.

20. A memory card including the semiconductor memory device according to claim 12.

* * * * *